United States Patent [19]

Everett

[11] 4,357,062

[45] Nov. 2, 1982

[54] UNIVERSAL CIRCUIT BOARD TEST FIXTURE

[75] Inventor: Stephen M. Everett, Livermore, Calif.

[73] Assignee: John Fluke Mfg. Co., Inc., Mountlake Terrace, Wash.

[21] Appl. No.: 198,020

[22] Filed: Oct. 17, 1980

Related U.S. Application Data

[63] Continuation-in-part of Ser. No. 102,055, Dec. 10, 1979, Pat. No. 4,289,367.

[51] Int. Cl.³ .......................................... H01R 29/00
[52] U.S. Cl. .................................... 339/18 R; 29/832; 29/845; 324/73 PC; 324/158 F; 339/75 M; 339/150 B
[58] Field of Search ................... 339/18 R, 64, 149 P, 339/150 B, 151 B, 108 TP, 255 R, 75 M; 29/832, 845; 324/158 F, 158 P, 73 PC

[56] References Cited

U.S. PATENT DOCUMENTS

| | | | |
|---|---|---|---|
| 2,918,648 | 12/1959 | Ludman et al. | 339/150 B |
| 3,434,095 | 3/1969 | De Rose | 339/255 R |
| 3,787,768 | 1/1974 | Kubota et al. | 324/158 F |
| 3,942,778 | 3/1976 | Fadiga et al. | 324/73 PC |
| 3,970,934 | 7/1976 | Aksu | 324/158 P |
| 4,108,528 | 8/1978 | Long et al. | 339/18 R |
| 4,115,735 | 9/1978 | Stanford | 324/158 F |
| 4,138,186 | 2/1979 | Long et al. | 339/18 R |
| 4,230,985 | 10/1980 | Matrone et al. | 324/73 PC |
| 4,232,928 | 11/1980 | Wickersham | 324/158 P |
| 4,321,533 | 3/1982 | Matrone | 324/73 PC |

FOREIGN PATENT DOCUMENTS

| | | | |
|---|---|---|---|
| 2617190 | 12/1976 | Fed. Rep. of Germany | 324/158 P |
| 2707900 | 8/1978 | Fed. Rep. of Germany | 324/158 P |
| 2905175 | 8/1980 | Fed. Rep. of Germany | 324/73 PC |

OTHER PUBLICATIONS

IBM Technical Disclosure Bulletin, vol. 17, No. 2, Jul. 1974, "Multipoint Test Probe".
IBM Technical Disclosure Bulletin, vol. 18, No. 8, 1/76, "Switching Probe", R. W. Beck.
Catalog Page: Thinline ® Universal Card Personalizer System (©1979 Fairchild Camera and Instrument Corp.).
Catalog Page: Thinline ® Universal Wired Personalizer (©1979 Fairchild Camera and Instrument Corp.).

*Primary Examiner*—John McQuade
*Attorney, Agent, or Firm*—Townsend and Townsend

[57] ABSTRACT

A universal circuit board probe assembly connects a variety of circuit board types to a diagnostic system. The probe assembly is an integrated system which includes a general purpose perforate platform having perforations in a uniform grid pattern, a plurality of floating connector pins of the type having an opposing double-action movement, a removable backing plate which confronts the platform, pin displacement modules which removably mount to the backing plate and are disposed to abut to the connector pins, means for aligning the backing plate with the platform and circuit board test points, means for urging the modules in contact with connector pins to activate the connector pins for testing, and means for causing the activated connector pins to engage test points on a circuit board to be tested.

11 Claims, 7 Drawing Figures

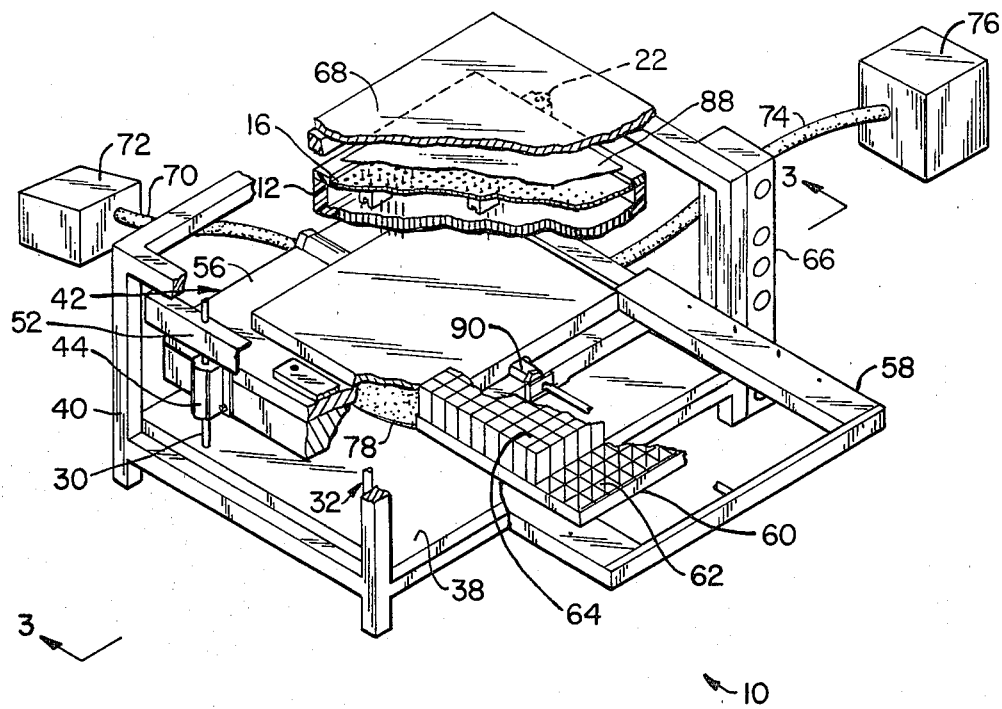
FIG._1.
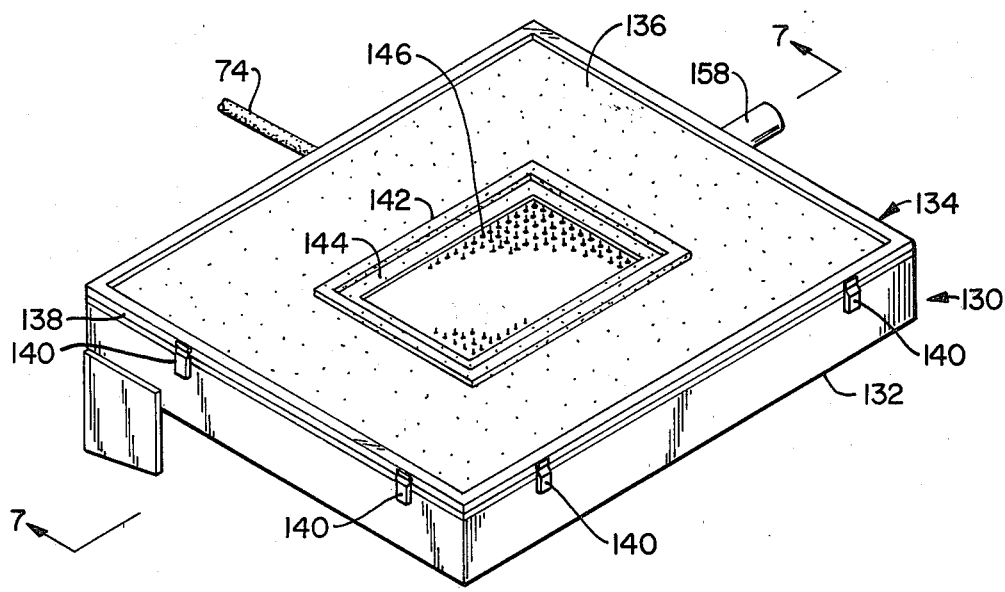
FIG._5.

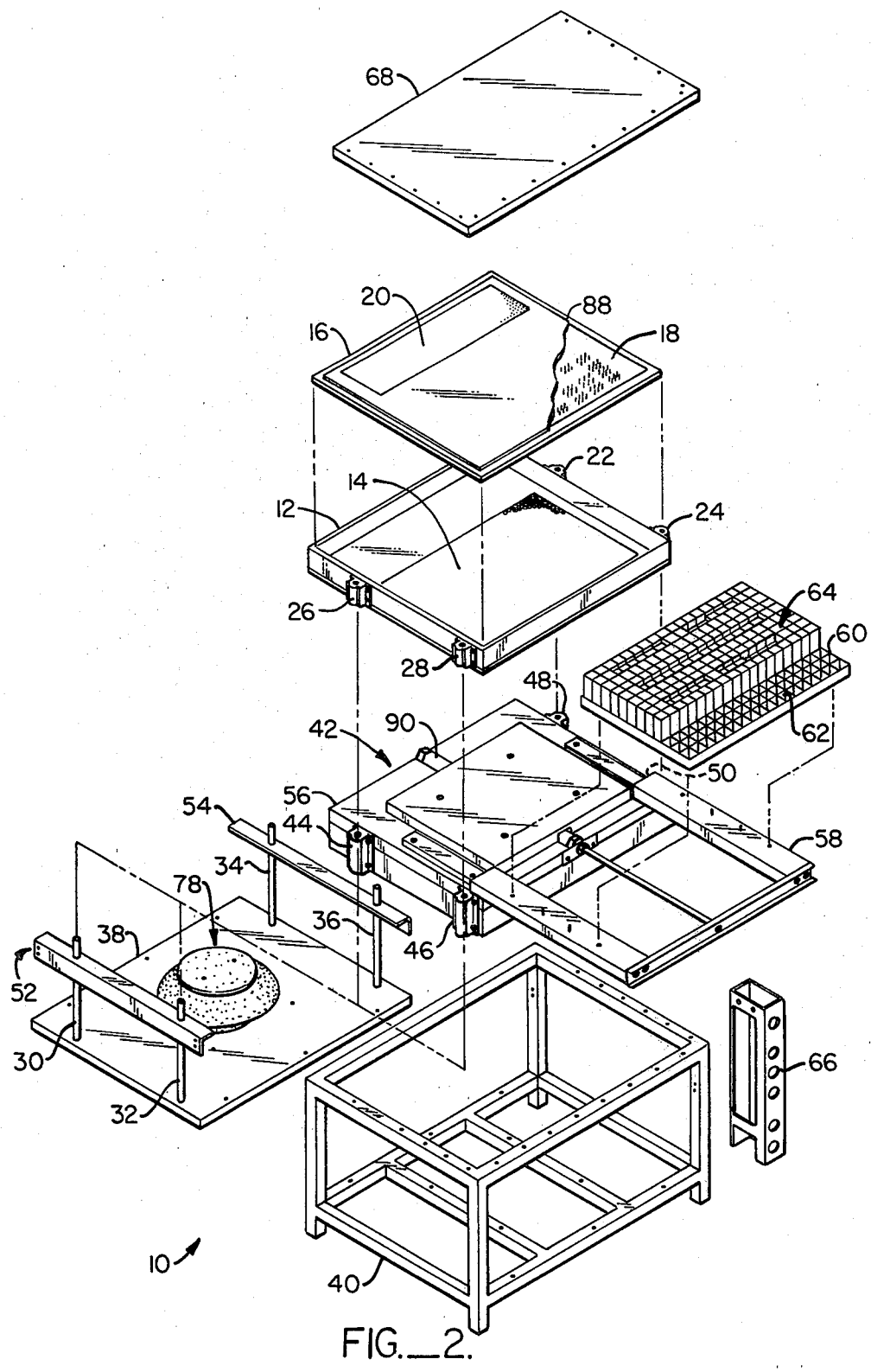
FIG._2.

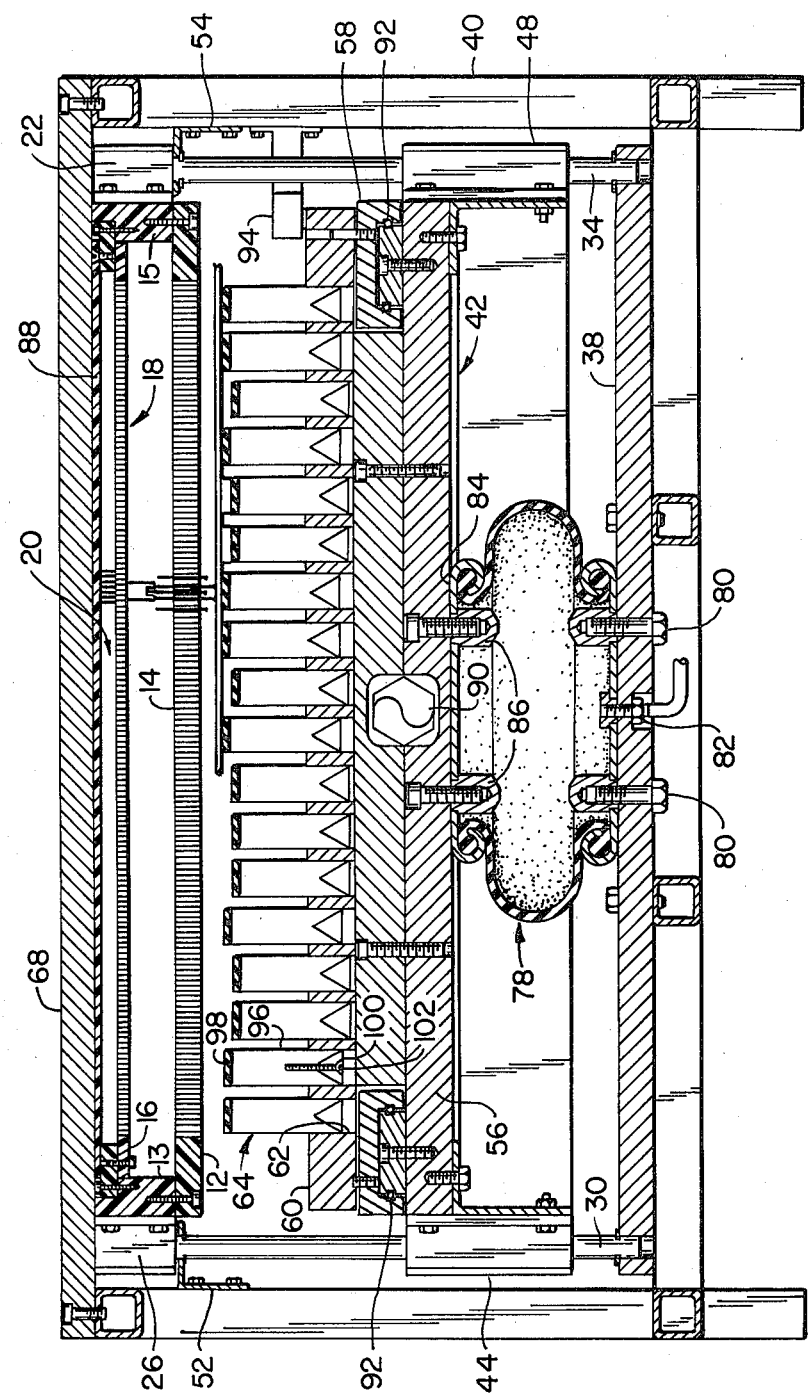
FIG._3.

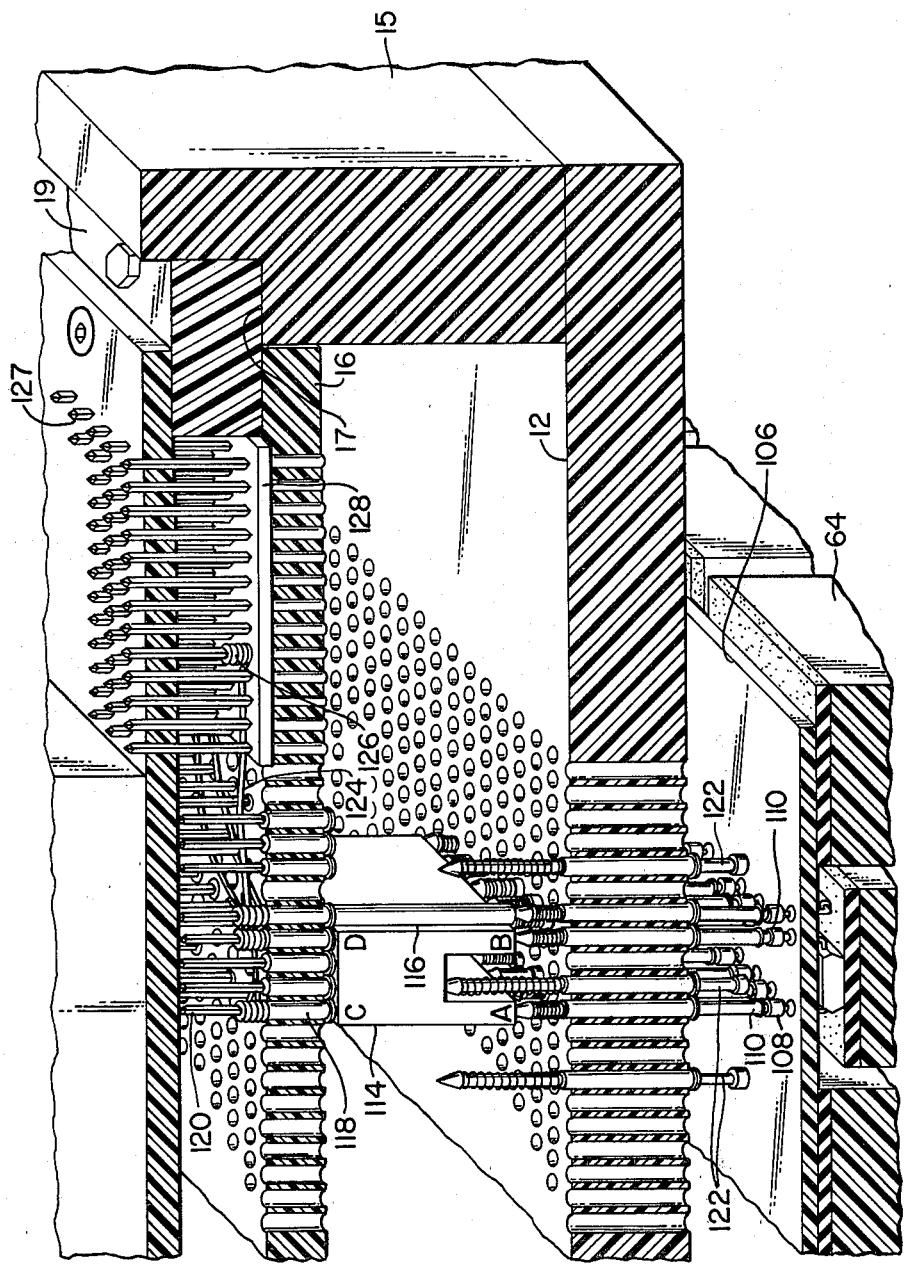
FIG._4.

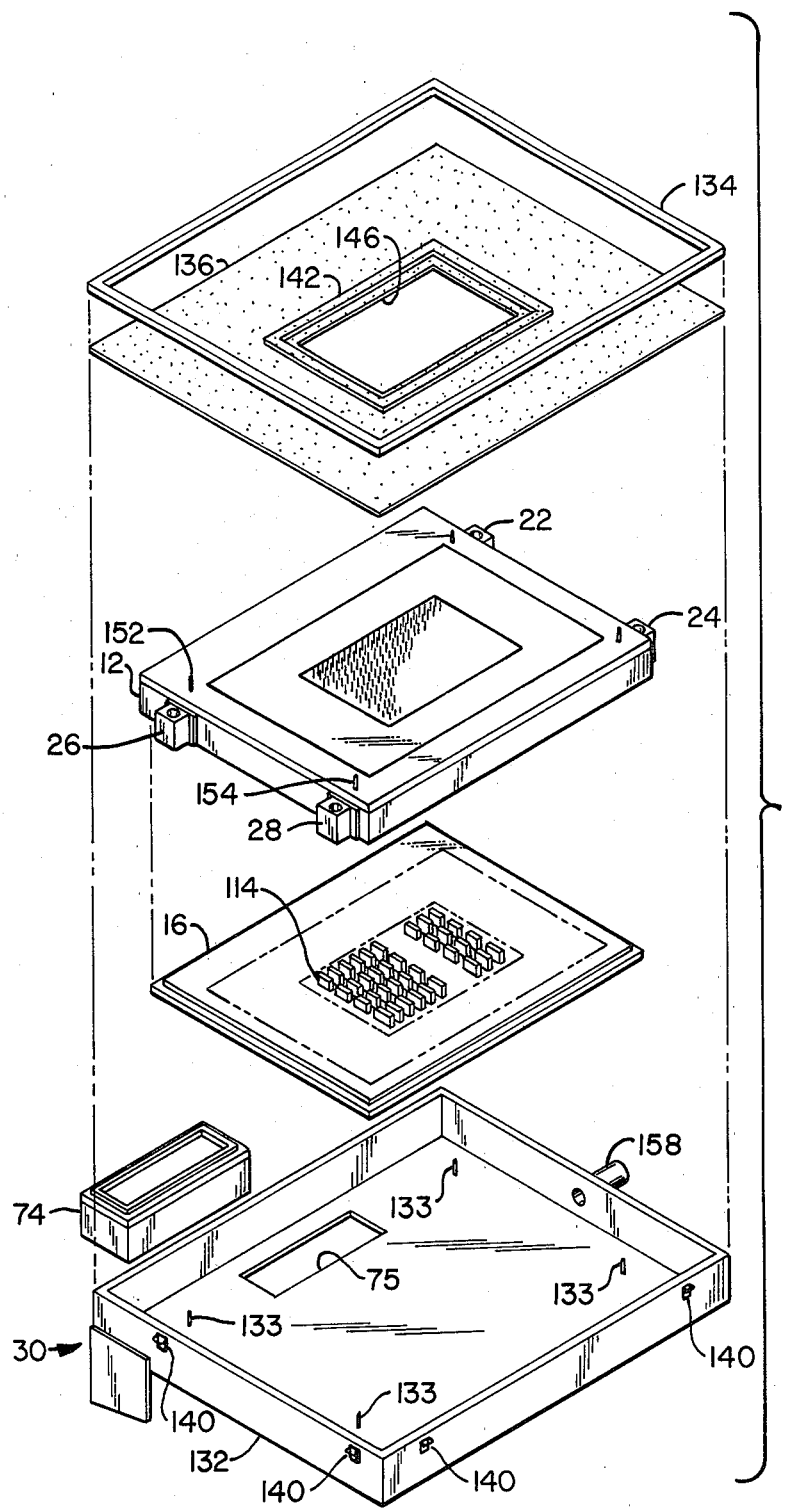
FIG._6.

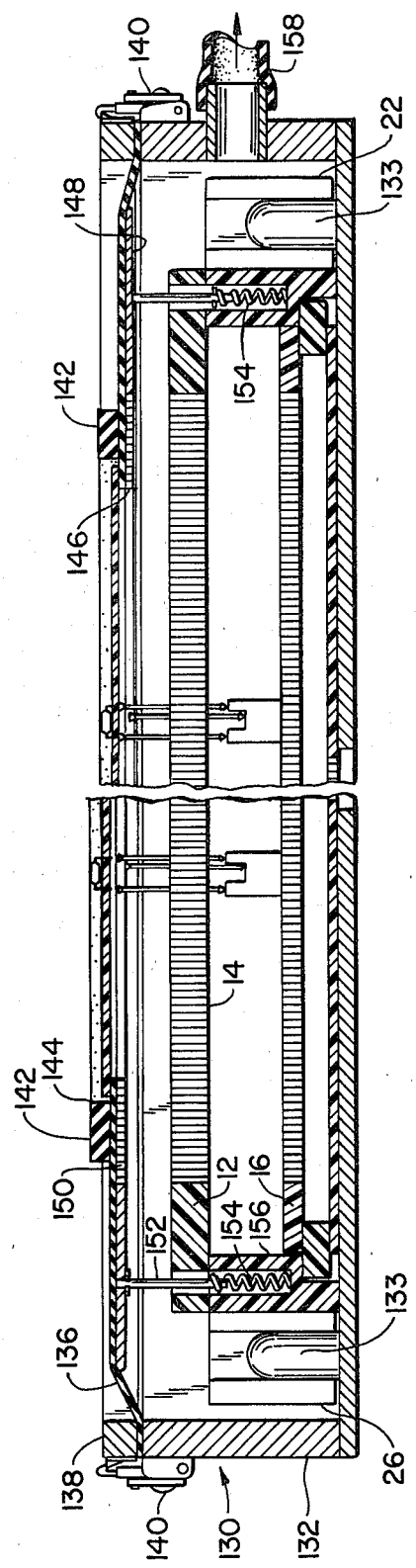
FIG._7.

UNIVERSAL CIRCUIT BOARD TEST FIXTURE

BACKGROUND OF THE INVENTION

This application is a continuation-in-part application of patent application Ser. No. 102,055, filed Dec. 10, 1979, now U.S. Pat. No. 4,289,367 issued Sept. 15, 1981, entitled Spring Loaded Connector Pin. The specification thereof is incorporated herein by reference.

1. Field of the Invention

The invention relates to test fixtures for generally planar electronic assemblies commonly known as circuit boards. In particular, the invention relates to a test fixture and bed-of-nails-type probe assembly for testing printed circuit boards, circuit systems and circuit subsystems mounted on printed circuit boards, including complex computer-based operating systems, and components mounted on printed circuit boards. All such apparatus are referred to herein as circuit boards.

In the diagnosis of defects in a circuit board or a unit under test (UUT), it is often necessary to effect electronic probe contact with selected terminals of selected components on the circuit board. Use of edge connections to circuit boards to diagnose faults in on-board components and systems is limited in usefulness if it is desirable to identify faults in individual circuit components. In such systems, it is frequently necessary to iterate through a series of time-consuming excitation and response tests to determine the location of faults in such a system. While iterative testing is a technique for improving diagnostic resolution, it is preferable to eliminate diagnostic iteration and maximize diagnostic resolution. Elimination of diagnostic iterations speeds testing procedures.

Efforts have been made to improve diagnostic resolution and to eliminate iterative testing. For this purpose, the so-called "bed-of-nails" contact assembly has been developed. A bed-of-nails is an array of contact pins mounted through a perforated platform in positions arranged in the pattern of contact locations on the circuit to be tested. In operation, the contact pins are normally abutted to the plated side of the circuit board to be tested in alignment with the designated test contact locations. Each contact pin is intended to collapse slightly in order to compensate for irregularities between the heights of contact locations.

It is frequently only necessary to test a few selected contact locations of a circuit. In the past, in such circumstances, it has nevertheless been necessary to make contact with all contact locations of a test fixture designed to accommodate the circuit under test. Moreover, a serious disadvantage of known testing apparatus is the lack of a general purpose contact assembly useable with a wide variety of circuit board layouts. What is therefore needed is an apparatus making it possible to provide test fixtures for general purpose circuit board test applications wherein only the specific test probes in use effect contact with the pattern to be tested.

In real time circuit board testing, it is desirable to provide real-time interaction between the unit under test and the diagnostic system. With existing test systems, particularly in board edge test systems, apparent fundamental limitations are imposed by the relatively slow speed of circuit operation in an interactive mode. The source of this limitation is the relatively long signal paths between the unit under test and the diagnostic system. In addition, the long signal paths are generally high impedance paths which are subject to spurious noise and interference.

2. Description of the Prior Art

Bed-of-nails fixtures are known to the art. The known prior art bed-of-nails fixtures have consisted of a dedicated probe assembly wherein a preselected number of contact pins is located in a specified pattern on a custom wired platform in alignment with test points on the back of a circuit board to be tested. One current concern, location resolution of test pins, has not been considered a significant concern in the prior art due to relatively low circuit density on many types of circuit boards. As circuit density increases, however, the location resolution of the contact pins becomes a significant concern.

One so-called universal fixture is the FF101 Series In-Circuit Test System of Fairchild Camera and Instrument Corp., which uses a card persoanlizer system. The system requires a specially prepared mask drilled to expose selected collapsible spring-loaded pins. The mask must actively compress unwanted pins. As a consequence, the pins require an unusually large travel clearance.

What is needed is a truly universal, relatively inexpensive and versatile bed-of-nails-type of probe assembly for use with automatic test equipment.

SUMMARY OF THE INVENTION

According to the invention, a universal circuit board probe assembly is provided for electrically connecting a variety of circuit board types to a diagnostic system, such as automatic test equipment (ATE). The probe assembly is an integrated system which includes at least the following elements:

A general purpose platform having a grid of perforations for receiving contact pins at any group of selected locations within the grid. For this purpose, the perforations are separated from one another by an amount equal to a standardized pin spacing.

A plurality of straight, floating, i.e., double-action, spring-loaded connector pins mounted through select perforations in the platform, and specifically in all locations corresponding to test points of a circuit board to be tested.

Rigid pin displacement modules wherein each module includes a plurality of feedthrough terminals with engagement pads disposed relative to one another according to the standardized pin spacing to abut to an end of specified double-action connector pins for activating the connector pins.

A removable backing plate to which the displacement modules are removably mounted. The backing plate includes electrical feedthroughs connected to a header which connects to the ATE.

Means for urging the modules into aligned contact with connector pins in order to cause the connector pins to displace into an extended or activated position.

And means for urging the activated connector pins into aligned engagement with the circuit board test points.

An important feature of the invention is the removably mountable displacement modules on the backing plate. Each circuit board is matched to a pattern of displacement modules mounted on the backing plate. Specifically, the displacement modules are placed with the engagement pads in a pattern corresponding to the image of the desired test points on the circuit board to be tested. The platform may be wholly or partially loaded with double-action connector pins. The double-action connector pins can be added at any time to the universal platform. However, only the displacement modules corresponding to the test points need to engage the preselected double-action connector pins. In this manner, the inventive system provides only the minimum number of probe connections necessary to probe the specific circuit under test.

Each test system is provided with a set of standardized interchangeable displacement modules designated for each type of component and circuit layout to be tested. For example, a sixteen pin dual-in-line package may be tested using a displacement module with sixteen electrically conductive engagement pads matching the pattern of the dual-in-line package and connected to a universal plug assembly in the backing plate. It is the displacement modules, therefore, which adapt a general purpose probe assembly into a mechanism for testing a specific circuit layout.

Two embodiments of the pin activating means are disclosed, a vacuum fixture and a pressure plate fixture. In the vacuum fixture, the platform and circuit board are integrated with a vacuum chamber which contains the backing plate with activated connector pins.

In the pressure plate fixture, a plate and a plate moving mechanism are provided to engage one face of an aligned circuit board to be tested. The opposing face is disposed to confront activated connector pins which protrude through the platform. The pressure plate fixture may be actuated by an expansible pneumatic bellows. This pneumatic fixture is very rugged and reliable, enabling the operator to quickly and easily load and unload a circuit board to be tested.

On the other hand, a vacuum fixture is very simple and allows operator access to one side of the circuit while a test is conducted. The vacuum fixture, however, requires a source of vacuum and cannot be used in systems where the vacuum pressure is insufficient to overcome the spring resistance of a large number of connector pins.

In order to maximize the interchangeability of parts, the spacing of all connector pin perforations, engagement pads and circuit board component layouts are generally standardized to a common alignment grid. For example, the entire layout of a circuit board could be standardized to place all connections in a pin grid having pins mounted on 0.100 inch centers. Such a grid corresponds to the standard pin and socket spacing of dual-in-line integrated circuit packages.

The invention will be better understood by reference to the following detailed description taken in conjunction with the accompanying drawings.

BRIEF DESCRIPTION OF THE DRAWINGS

FIG. 1 is a perspective view in partial cutaway showing a portion of a pneumatic test fixture according to the invention.

FIG. 2 is an exploded perspective view of elements of the pneumatic test fixture of FIG. 1.

FIG. 3 is a side cross-sectional view of a portion of the fixture according to the invention.

FIG. 4 is a perspective view as seen from section line 3—3 of FIG. 1 showing a circuit board in position for testing.

FIG. 5 is a perspective view of a vacuum-type test fixture according to the invention.

FIG. 6 is an exploded view of a vacuum-type fixture according to the invention.

FIG. 7 is a cross-sectional view along section lines 7—7 of FIG. 5.

DETAILED DESCRIPTION OF SPECIFIC EMBODIMENTS

Turning to FIG. 1 there is shown a perspective view of a test fixture 10 which is pneumatically actuated. FIG. 2 is an exploded view showing more clearly all of the elements and the separability of the elements in the test fixture 10. FIG. 3 is a cross section of the test fixture 10. Like features in all figures are given the same numerical designation. Principal operative elements are a perforate platform 12 with a honeycomb hole array 14 for carrying double-action contact pins 122 (FIG. 4) of the type disclosed in the parent application and incorporated herein by reference, a backing plate 16 which is removably mountable to the platform 12 and which has a honeycomb area 18 aligned with the platform honeycomb area 14, and an interface header area 20. The perforate platform 12, backing plate 16 and header 20 are mounted together as a unit. The backing plate 16 and the platform 12 are separated by spacer blocks 13 and 15, all of which is readily disassembled. Pillow blocks 22, 24, 26, 28 are mounted on the side of the platform 12 in alignment with journal shafts 30, 32, 34, 36 which are perpendicular to the plane of the platform 12. The journal shafts 30, 32, 34, 36 are mounted to a base plate 38 which fits in a frame 40.

A circuit assembly support platen 42 is mounted on pillow blocks 44, 46, 48, 50 which are slideably mounted on the journal shafts 30, 32, 34, 36 between the base plate 38 and cross-braces 52 and 54. The cross-braces 52, 54 support the platform 12. The platen 42 comprises a table 56, a slide 58 mounted to the table 56 and disposed to move laterally with respect to the surface of the table 56, and a printed circuit board (PCB) support floor 60 mounted to the slide. The PCB support floor 60 is provided with a grid of sockets 62 for receiving support plugs 64 whose height in the socket is adjustable to satisfy height irregularity in a printed circuit under test as hereinafter explained.

The frame 40 is provided with a control panel 66 on one side and a cover plate 68 across the top. The side of the frame 40 is open for the slide 58 and floor 60 to which a circuit board may be mounted. An electrical cable 70 couples a fully wired header 20 to automatic test equipment 72 and an air line 74 connects pneumatically actuated circuitry as hereinafter explained to a source of air 76. The system 10 employs a pneumatically expansible air bag 78 mounted between the base plate 38 and the table 56 of the platen 42 so that the platen 42 can be urged reciprocally along the journal shafts 30, 32, 34 and 36 between the base plate 38 and the cross-braces 52, 54.

Referring specifically to FIG. 3, the air bag 78 is mounted on the base plate 38 by bolts 80 and is connected to a source of air through a pneumatic coupling 82 through a hole in the base plate 38. Compressed air is introduced and expelled through the pneumatic coupling 82 depending upon the desired position of the bag top face 84 relative to the base plate 38. The bag top face 84 is coupled by bolts 86 to the platen 42. Thus, the piston 78 is operative to move the platen 42 as guided by the journal shafts 30, 32, 34, 36.

The perforate platform 12 and backing plate 16 are constructed of nonconductive materials such as acrylic plastic or fiberglass. The platform 12 and related assembly may also include a cover 88 mounted directly over the backing plate 16 which serves to protect the area above the interface header 20.

The platen 42 provides mounting of a pneumatically driven piston 90 disposed to provide lateral motion of the support floor 60, that is, parallel to the rails 92 of the slide 58. Pneumatic sensors are mounted to the frame 40 and to the platen 42 in order to sense and delimit the movement of the platen 42 and the slide 58, respectively.

Of special interest is the support floor 60 and support plugs 64. The support plugs 64 may be circular or rectangular in lateral cross-section so long as they are generally tubular. The cross-sectional diameter is preferably on the order of less than about 20 mm to accommodate circuit board components of customary size. Each support plug 64 comprises a shaft 96, a pliant face 98, a cap 100 mounted on the end opposing the face and a tension screw 102 which is disposed longitudinally through the cap 100 and screws into the body of the shaft 96. The plug 64 is slideably moveable within the sockets 62, and the cap 100 is beveled to fit inside a frustoconical recess in the base of the plug 64. The plug 64 is secured in place by tightening the tension screw 102, thus forcing the cap 100 against the frustoconical recess. The sides of the recess 104 are slitted so that the compressed cap 100 acts to cause the base of the shaft 96 to expand within the socket 62 and lock the plug 64 in place. Each of the plugs 64 are adjusted in height to accommodate the complementary height of components a circuit board (not shown) laid face down on the support plugs 64 with the components thereon provided a reasonably uniform support surface by the support plugs 64. Such a circuit board can be uniformly urged into juxtaposition with the confronting face of the platform 12.

FIG. 4 illustrates how the support plugs 64 cooperate with a circuit board 106 to cause the test points of the circuit board 106 to abut to probe tips 108 of actuated double-action probe connector pins 110 mounted in the platform 12.

Actuation of a connector pin 110 is effected by placement of either a module 114 or transfer pin 116 on the backing plate 16 in alignment with the heads of selected connector pins and locating the backing plates in a fixed spaced relation to the top of the platform 12 to compress the selected connector pins and to thereby cause the probe tips 108 to extend with axial movement of a shaft portion. The spacer block 15 may have a recess 17 in which the backing plate 16 or a rim 19 of the backing plate 16 may rest.

There is a type of module, called a double row module 114, or DIP module, which actuates pins whose spacing corresponds to the pin spacing of a dual-in-line pin (DIP) circuit package. In addition, a single point transfer pin 116 may be also be mounted to the backing plate 16. The modules 114 and transfer pins 116 have individual conductive pads (not shown) on one face and conductive paths therethrough to plug pins (not shown) which fit in sockets 118 in the perforations of backing plate 16. The sockets 118 are preferably integrally formed with terminal wrap pins 120 which extend from the side of the backing plate 16 opposing the platform 12. A useful feature of the invention is the removability of the modules 114 and transfer pins 116 from the backing plate 16 and the mountability thereof in virtually any orientation in the honeycomb grid 18. This ease of removability renders the invention extremely versatile and easily and quickly adaptable to a variety of circuit patterns.

An important element useful is the double acting probe connector pin. The connector pin is a standardized device which can assume one of two positions, a rest position as in the probes 122 (hereinafter the rest probes 122) and an actuated position as in the actuated probes 110. A rest probe 122 rests unused with its terminal-contacting tip 108 withdrawn toward the platform 12. The purpose of the modules 114 and transfer pin 116 is to actuate, that is, to urge the probe tip 108 to an extended position. For example, the actuated probes 110 are urged by extensions of the modules 114 and of the transfer pins 116 to a second position with the tips 108 extended to engage selected points on a printed circuit board under test 106. The tips 108 are spring-loaded so they may withdraw to compensate for the irregularities in levels among contact points.

Since the modules 114 and transfer pins 116 are solely responsible for the actuation of the probes, the platform 12 can be essentially permanently mounted in a fixture and provided with a full array of probes without danger of creating interference with or among points on the circuit board 106 which are not to be tested. The separability of actuated and floating probes by means of removable modules also enables the system user to selectively build up the number of probes in a test system, purchasing only those probes necessary at any one time to test a specific circuit board. The system user can then defer the expenses of unneeded excess probes until more probes are actually needed. As more probes are added the fixture becomes a general purpose system with high test point resolution which is readily and quickly adapted and customized to a specific circuit board.

In a typical test environment, the signal path from the circuit board under test 106 is from the tip 108 of an actuated probe 110 touching a conductive test point, through its body to a test pad at the base of a displacement modules 114 or to the tip of a transfer pin 116, and then through a conductive path in the module 114 or transfer pin 116 to a plug in the socket 118, thence through the backing plate 16, thence through an electrical coupling 124 on the terminal 120 to a header terminal 126 mounted on a header interface 128, and finally to a multiple pin plug 127. The plug 127 may then be connected to any multiple input test device such as an automatic tester through a conventional socket (not shown) and cable. In a similar manner there is a conductive signal path from the outside world to any point on the circuit board under test 106 through an actuated probe 110.

Thus far a pneumatic test fixture 10 has been described, which is particularly suited to high-volume, high-reliability automatic testing or large numbers of circuit boards where no access is needed or desired to the face of the tested circuit board during the test. FIG. 5 illustrates an alternative embodiment for experiment work. It comprises a vacuum fixture 130 operative according to the invention. The vacuum fixture 130 is considerably simpler in mechanical construction as compared to a pneumatic test fixture 10 in that atmospheric air pressure directly on the circuit board under test is employed to effect a coupling between connector pins and circuit test points.

Referring to FIGS. 5, 6 and 7 together, the vacuum fixture 130 comprises a closed box 132 with a removable frame 134 which together with a membrane 136 form a vacuum chamber. The membrane 136 is attached across the frame 134 around the margin 138 of the frame 134. Quick-release clasps 140 (FIG. 7) join the frame 134 and the box 132.

Mounted on the membrane 136 is a sealing border 142 whose shape is customized to the circuit board to be tested. The sealing border is typically glued to the membrane and consists of foam rubber strips such as conventional foam weather-stripping. The sealing border 142 defines a lip 144 on its laterally interior margin of a height at least as great or greater than the thickness of a circuit board to be tested. The lip 144 is preferably disposed as close as is possible to the dimensions of the circuit board for which outline of the lip 144 is specified. The membrane 136 is cut out to provide an opening 146 within the borders of the sealing border 142 whereby the test points on the underside of the circuit to be tested may be exposed to the interior of the fixture 130. A rigid backing sheet 148 (FIG. 7) to the membrane 136 has a cutout matching the face of the circuit board under test. The backing sheet 148 may be a standardized portion of the test fixture, or it may have a cutout of a specified shape developed for the circuit to be tested.

The backing sheet 148 with the rubber membrane 136 is suspended over the box 132 on a plurality of support pins 152 mounted on compression springs 154 within a housing 156 in the box 132. Within the box 132, a platform 12 and a backing plate 16 are mounted as a unit. The unit may be mounted on machine pins 133 for pillow blocks 22, 24, 26, 28 in alignment with the opening 146. Alternatively, the unit may be bolted in place at aligned locations in the box 132. The platform-backing plate unit may be exactly the same assembly as used in the embodiment of FIGS. 1–4 and therefore requires no further explanation. The unit is shown without the probes in FIG. 7. The backing plate 16 interfaces with a header connector 74 through a sealable access hole 75 in the fixture 130.

The assembled vacuum fixture of FIGS. 5–7 operates as follows: A vacuum is drawn through vacuum outlet 158 to cause a differential of pressure across the membrane 136. The pressure produces a force on a circuit board placed within the lip 144 of the sealing border 142 to urge it against actuated probes 110 (as in FIG. 4) through the platform 12 test points on the aligned circuit board. (Machine pins may assure alignment, if needed.) The actuated probes 110 can then conduct signals to and from the circuit board through the header connector 74 in the fixture 132. The desired test is then conducted. A vacuum is maintained throughout the test procedure. The user retains access to the top of the circuit board, because there is no mechanical compression means opposing the backing plate-platform assembly.

The invention has now been explained with respect to specific embodiments. Other embodiments will be suggested to the artisan or ordinary skill upon reference to this disclosure. It is therefore not intended that the invention be limited except as indicated by the appended claims.

What is claimed is:

1. An apparatus for establishing electrical connections to test points on a circuit board wherein components on said circuit board are disposed with terminals located at integral multiples of standardized spacing comprising:

a perforate platform having a plurality of perforations for receiving contact probes, each of the perforations being disposed at integral multiples of said standardized spacing in a grid pattern, the perforations being separated from one another by a distance equal to a multiple of said standardized spacing;

a plurality of straight double-action conductive connector pins defining contact probes having a first end for contacting circuit board test points and an opposing actuating end, each pin having a shaft portion movable from a first rest position to which the pin shaft is spring-biased and a second actuated position upon pressure contact on said actuating end, said connector pins being mounted through said perforations of said platform in at least all locations corresponding to test points of a circuit board to be tested;

at least one rigid pin displacement means, said pin displacement means including at least one conductive path therethrough from a first face to an opposing second face and a plug connector on said second opposing face, said first face being adapted to be disposed with conductive paths in alignment with said standardized spacing of said perforations, said plug connector being mountable in socket means in a backing plate;

a backing plate removably mountable to said platform, said backing plate including socket means for mounting said displacement means to said backing plate;

means for joining said backing plate with said platform, including means for urging said displacement means into contact with said connector pins in order to actuate said connector pins by displacement into a position for engaging circuit board test points; and means for urging relative movement of said platform and said circuit board to place said actuated connector pins in engagement with the circuit board test points for establishing said electrical connections.

2. The apparatus as claimed in claim 1 wherein said displacement means are modules and pins removably mountable to said backing plate and include plug connector for mounting to socket means in said backing plate.

3. The apparatus according to claim 1 wherein said means for urging said displacement means comprises a plurality of fastening means which connect said backing plate to said platform.

4. The apparatus according to claim 3 wherein said urging means comprises a vacuum source in communication with a vacuum chamber for cooperation with a circuit board abutted to said platform such that said circuit board is held against said connector pins by vacuum pressure.

5. The apparatus according to claim 3 wherein said urging means comprises a support means having a plurality of support plugs having variable heights adapted to receive the side of a circuit board opposing said test points; and a pneumatically actuated cylinder operative to urge said support means toward said connector pins such that a circuit board is held in compression against said connector pins.

6. The apparatus as claimed in claim 5 wherein said platform is mounted on rails for laterally displacing said platform between a first position for mounting and unmounting a circuit board and a second position for engaging said test points; and means for sensing the lateral and vertical position of said platform.

7. A method for connecting a plurality of electrical test leads to test points on a circuit board wherein components on said circuit board are disposed with terminals through said board at integral multiples of a standardized spacing, said method comprising the steps of:

mounting a plurality of straight double-action conductive connector pins defining contact probes in a planar perforate platform having a grid of perforations arranged at integral multiples of said standardized spacing, said connector pins each having a first end for contacting circuit board test points and an opposing actuating end, each connector pin having a shaft portion movable from a first rest position to which the pin shaft is spring-biased and a second actuated position wherein said first end is extended upon pressure contact on said actuating end;

placing at least one rigid pin displacement means in a plug connector on a backing plate having a plurality of plug connectors disposed at integral multiples of said standardized spacing, said displacement means including at least one conductive path from a first face to a second opposing face at means connecting to said plug connector;

joining said backing plate to said platform with said displacement means interposed to abut to said actuating end of at least one of said connector pins under pressure thereby to cause said first end of said connector pin to extend away from said perforate platform and to establish a conductive path between said first end and said plug connector, said plug connector being electrically coupled to said electrical test leads; and urging relative movement of said platform and said circuit board in alignment with said circuit board thereby to place said first ends of said actuated connector pins in engagement with the circuit board test points for establishing said electrical connections.

8. The method of claim 7 wherein said urging of said platform comprises creating a differential air pressure across said circuit board by drawing a vacuum sufficient to move said circuit board relative to said platform.

9. The method of claim 7 wherein said urging of said platform comprises mounting said circuit board on a means for mechanically supporting said circuit board and urging said supporting means toward said platform.

10. The method of claim 9 wherein said supporting means urging comprises applying pneumatic pressure to a pneumatic piston coupled between said supporting means and a frame supporting said platform.

11. An apparatus for attaching connections to selected test points on a circuit board comprising:

perforate platform means for supporting a plurality of pins at uniform spacing;

a plurality of spring-loaded conductive pins each having a shaft, each pin capable of assuming either a shaft rest position or a shaft actuated position, said actuated position comprising an extension of said shaft, said pins being insertable through said platform means; and means operative to abut to selected ones of said pins for actuating said pins, said pin actuating means including a backing plate means for displacing said pins, said displacing means being plug mountable to said backing plate in said pin actuating means.

* * * * *